(12) United States Patent
LaJoie et al.

(10) Patent No.: US 11,404,536 B2
(45) Date of Patent: Aug. 2, 2022

(54) THIN-FILM TRANSISTOR STRUCTURES WITH GAS SPACER

(71) Applicant: INTEL CORPORATION, Santa Clara, CA (US)

(72) Inventors: Travis W. LaJoie, Forest Grove, OR (US); Abhishek A. Sharma, Hillsboro, OR (US); Juan Alzate-Vinasco, Tigard, OR (US); Chieh-Jen Ku, Hillsboro, OR (US); Shem Ogadhoh, Beaverton, OR (US); Allen B. Gardiner, Portland, OR (US); Blake Lin, Portland, OR (US); Yih Wang, Portland, OR (US); Pei-Hua Wang, Beaverton, OR (US); Jack T. Kavalieros, Portland, OR (US); Bernhard Sell, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 865 days.

(21) Appl. No.: 15/941,557

(22) Filed: Mar. 30, 2018

(65) Prior Publication Data

US 2019/0305081 A1 Oct. 3, 2019

(51) Int. Cl.
| H01L 29/06 | (2006.01) |
| H01L 27/12 | (2006.01) |
| H01L 27/105 | (2006.01) |
| H01L 21/02 | (2006.01) |
| H01L 29/423 | (2006.01) |
| H01L 21/764 | (2006.01) |
| H01L 21/768 | (2006.01) |

(52) U.S. Cl.
CPC ...... *H01L 29/0649* (2013.01); *H01L 21/0228* (2013.01); *H01L 21/02266* (2013.01); *H01L 21/764* (2013.01); *H01L 21/7682* (2013.01); *H01L 27/1052* (2013.01); *H01L 27/124* (2013.01); *H01L 27/1248* (2013.01); *H01L 27/1262* (2013.01); *H01L 29/42384* (2013.01)

(58) Field of Classification Search
CPC ............ H01L 29/0649; H01L 27/1052; H01L 27/1248; H01L 29/42384; H01L 21/764; H01L 21/7682
See application file for complete search history.

(56) References Cited

U.S. PATENT DOCUMENTS

| 8,421,082 B1* | 4/2013 | Yang .................... B81B 7/0038 |
| | | 257/69 |
| 9,892,961 B1* | 2/2018 | Cheng ................. H01L 21/0217 |
| 9,922,973 B1* | 3/2018 | Shank ............. H01L 21/823481 |

(Continued)

*Primary Examiner* — Feifei Yeung Lopez
(74) *Attorney, Agent, or Firm* — Schwabe, Williamson & Wyatt, P.C.

(57) ABSTRACT

An integrated circuit includes a base, a first transistor structure on or above the base, and a second transistor structure on or above the base, where the second transistor structure is spaced from the first transistor structure. An insulator material at least partially encapsulates an airgap or other gas pocket laterally between the first transistor structure and the second transistor structure. The gas pocket is at least 5 nm in height and at least 5 nm wide according to an embodiment, and in some cases is as tall or taller than active device layers of the transistor structures it separates.

13 Claims, 6 Drawing Sheets

(56) References Cited

U.S. PATENT DOCUMENTS

| | | | | |
|---|---|---|---|---|
| 2012/0037975 A1* | 2/2012 | Cho | ................... | H01L 29/42336 |
| | | | | 257/321 |
| 2013/0084696 A1* | 4/2013 | Kim | ................... | H01L 21/76801 |
| | | | | 438/588 |
| 2013/0248950 A1* | 9/2013 | Kang | ................... | H01L 29/4991 |
| | | | | 257/288 |
| 2013/0320459 A1* | 12/2013 | Shue | ............... | H01L 21/823475 |
| | | | | 438/296 |
| 2017/0148914 A1* | 5/2017 | Lee | ..................... | H01L 29/7843 |
| 2018/0190810 A1* | 7/2018 | Li | .......................... | H01L 29/785 |
| 2019/0148215 A1* | 5/2019 | Chang | ............. | H01L 21/823878 |
| | | | | 257/369 |
| 2019/0157414 A1* | 5/2019 | Ando | ................ | H01L 29/78696 |

\* cited by examiner

THIN-FILM TRANSISTOR STRUCTURES WITH GAS SPACER

BACKGROUND

Manufacturers and consumers of integrated circuits are motivated to increase the component density to reduce the overall size of the ultimate product, as well as manufacturing costs and the purchase price to consumers. However, a number of non-trivial issues are associated with such increased component density.

Figure 1:
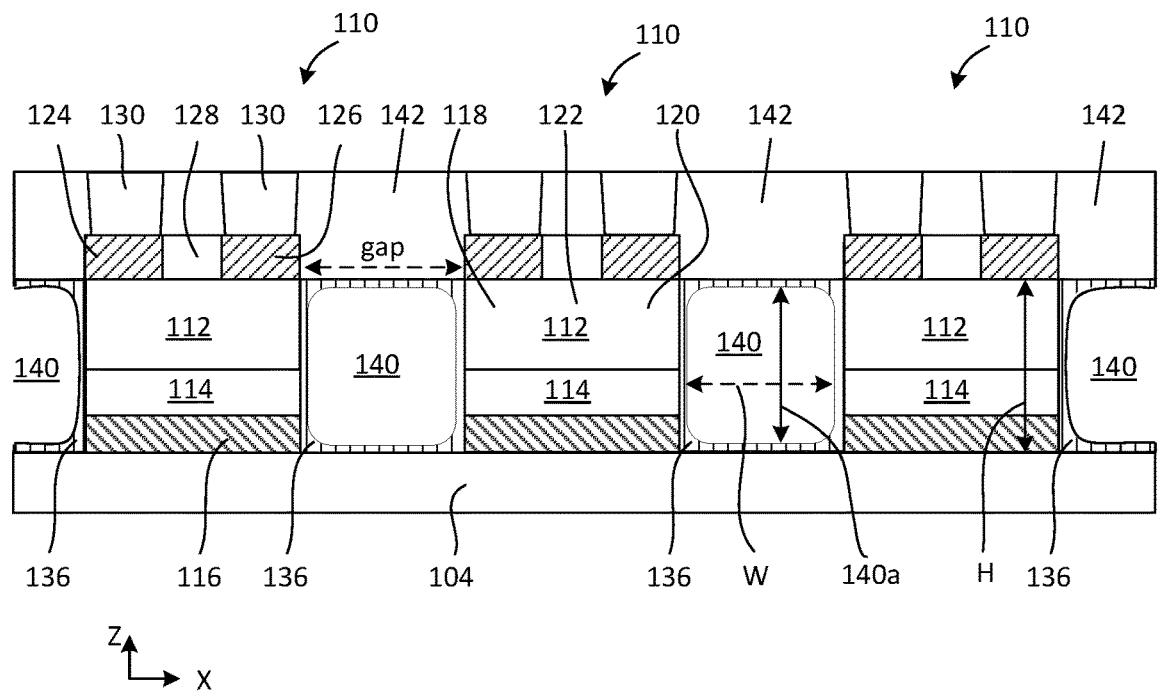
FIG. 1 illustrates a cross-sectional view of part of an integrated circuit showing transistor structures separated by an airgap or other gas pocket encapsulated in isolation material, in accordance with an embodiment of the present disclosure.

The figures depict various embodiments of the present disclosure for purposes of illustration only. Numerous variations, configurations, and other embodiments will be apparent from the following detailed discussion.

DETAILED DESCRIPTION

The present disclosure relates to an integrated circuit having adjacent transistor structures spaced apart by an airgap or other gas pocket between the adjacent transistor structures. The present disclosure also relates to methodologies for fabricating such transistor structures and integrated circuits implementing the same.

General Overview

The size of transistor devices has continued to decrease and the density of devices in an integrated circuit has continued to increase. Such trends give rise to a number of non-trivial issues. In a bitcell array, for example, the smaller size and increased density of transistor structures can result in parasitic capacitance and cross talk between adjacent transistor devices. For instance, the source electrode of one transistor and the drain electrode of an adjacent transistor may be spaced sufficiently close to result in a parasitic capacitance between these structures. In particular, a parasitic capacitor is effectively formed by the adjacent metal electrodes and the dielectric therebetween. Such parasitic effects limit the performance of the individual transistor or bitcell as well as the performance of the integrated circuit as a whole. For example, parasitic capacitance can increase the resistance-capacitance (RC) time delay for the circuit, thereby affecting the speed of the memory read and write functions. Therefore, to improve the performance of transistors in a memory structure, for example, it would be desirable to implement structures and methodologies that reduce parasitic capacitance between adjacent transistor structures in integrated circuits.

Thus, in accordance with some embodiments of the present disclosure, techniques are provided for forming an integrated circuit that includes adjacent transistor structures with an airgap or other gas pocket between the adjacent transistor structures. In some embodiments, the transistor structures can be arranged in an array with a gap between adjacent transistor structures in rows, a gap between adjacent transistor structures in columns, or both. In one example embodiment, transistor structures are bottom gate thin film transistor structures that include a dielectric layer, a layer of semiconductor material (e.g., device layer), and a gate electrode. Other embodiments may use any number of transistor structures, as will be appreciated in light of this disclosure In some such embodiments, the vertical height of the structure is from about 10 nm to 1000 nm, and the horizontal length of the gap between adjacent transistor structures is from about 2 nm to 200 nm, so as to provide a gap having a height:width aspect ratio of 5:1 or greater. Instead of filling the relatively high-aspect ratio gap with isolation material, the gap includes a void filled with gas, such as air. In some embodiments, the void is encapsulated within the isolation material, such that isolation material defines all sides of the void. In one such specific example embodiment, a layer of isolation material is deposited on the sidewalls of adjacent transistor structures and has a thickness of less than 5 nm, such as about 2-3 nm. As further isolation material is deposited, the material closes on itself or otherwise pinches off at the top of the gap to encapsulate a gas pocket. As will be appreciated, by adjusting the aspect ratio of the gap, the pinch-off effect can be generally controlled which in turn generally controls the sizes of the airgap or gas pocket. In particular, high aspect ratio trenches or so-called gaps, such as gaps having a height:width aspect ratio of 5:1 or greater, will tend to pinch-off and leave a void, particularly when the isolation material is deposited via non-conformal deposition techniques such as chemical or physical vapor deposition (CVD or PVD).

In some embodiments, the dielectric constant of the airgap (or other gas pocket) effectively dominates the overall dielectric constant of the region between the transistor structures. In general, the relative dielectric constant of air and other gases approaches that of a vacuum. Accordingly, the gas pocket reduces the relative dielectric constant between adjacent transistor structures to below 3.6 (the approximate relative dielectric constant of silicon dioxide), such as below 3.0, below 2.0, or less. In some specific example embodiments, the relative dielectric constant of the volume between adjacent transistor structures is about 1.0, closely approximating the electrical behavior of a vacuum between adjacent transistor structures, which is 1.0 by definition.

As will be further appreciated in light of this disclosure, note that the voids can be formed with features other than isolation material. For instance, in some embodiments, the void is effectively encapsulated by different features and materials of the structure. In one such example case, the substrate provides the bottom of the void, sidewalls of adjacent transistor structures (or other adjacent devices in the so-called device layer) provide sidewalls of the void, and isolation material provides the top of the void. In any such cases, and as previously explained, the aspect ratio of the unfilled gap or void width to the vertical height of the transistor structure can be selected to provide a pocket of encapsulated gas with the desired size, such that when the overlying isolation material is deposited, pinch-off is achieved thereby defining an airgap or other gas pocket.

The use of "group III-V semiconductor material" (or "group III-V material" or generally, "group III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. Group III may also be known as the boron group or IUPAC group 13, group IV may also be known as the carbon group or IUPAC group 14, and group V may also be known as the nitrogen family or IUPAC group 15, for example.

Materials that are different or compositionally different as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations.

As also used herein, the expression "X includes at least one of A or B" refers to an X that may include, for example, just A only, just B only, or both A and B. To this end, an X that includes at least one of A or B is not to be understood as an X that requires each of A and B, unless expressly stated. For instance, the expression "X includes A and B" refers to an X that expressly includes both A and B. Moreover, this is true for any number of items greater than two, where "at least one" item is included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly stated. For instance, the expression "X includes A, B, and C" refers to an X that expressly includes each of A, B, and C. Likewise, the expression "X included in at least one of A or B" refers to an X that may be included, for example, in just A only, in just B only, or in both A and B. The above discussion with respect to "X includes at least one of A or B" equally applies here, as will be appreciated.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate, for example, adjacent transistor structures (e.g., thin-film transistors (TFTs)) with an airgap or other gas pocket in the gap between transistor structures. For example, TEM can be useful to show a cross section of the structure to show a gas pocket encapsulated in isolation material between adjacent transistor structures. In some embodiments, the techniques described herein may be detected based on the benefits derived from their use, which includes transistors with reduced parasitic capacitance.

Architecture and Methodology

FIG. 1 illustrates a cross-sectional view of part of an example integrated circuit that includes a plurality of transistor structures 110. Each transistor structure 110 includes an active layer 112 of semiconductor material, a gate electrode 116, and a dielectric layer 114 between the active layer 112 and the gate electrode 116. The active layer 112 includes a source region 118, a drain region 120, and a channel region 122 (or body) between the source region 118 and the drain region 120. A source electrode 124 contacts the source region 118 and a drain electrode 126 contacts the drain region 120. In some embodiments, the source electrode 124 and the drain electrode 126 are separated by a layer of isolation material 128. Metal interconnect 130 electrically connects the source electrode 124 and drain electrode 126 to other portions of the integrated circuit, such as a bitline or contact metallization layer.

Adjacent transistor structures 110 as spaced from one another by a gap that contains isolation material 136. For example, the isolation material 136 is a layer of material on the sidewalls 138 of each transistor structure 110 and encapsulates a gas pocket 140 or void within the isolation material 136. In one example, the isolation material 136 has a thickness less than 10 nm between the sidewalls 138 and substrate 104. As will be discussed in more detail below, the aspect ratio of the transistor structure 110 and gap 134, in addition to methods of applying the isolation material 136, can be selected to result in the isolation material 136 defining a closed shape between transistor structures 110 that encloses the gas pocket 140. An interlayer dielectric 142 can be formed or deposited on top of the isolation material 136 to fill open areas in the transistor structures 110.

In some embodiments, the gas pocket 140 is laterally between adjacent transistor structures 110. In one such example, an imaginary horizontal plane extends through the gas pocket 140 as well as both of the active layers 112 of the adjacent transistor structures 110. In some such embodiments, the gas pocket 140 is generally centered vertically on the active layer 112 of a given transistor structure 110 (see, for instance, FIG. 3D, which will be discussed in turn). In another such example embodiment, the gas pocket 140 extends vertically from approximately the bottom surface of the active layer 112 to approximately the top surface of the active layer 112. In another such example embodiment, the gas pocket 140 extends vertically above and/or vertically below the active layer 112. In yet another example embodiment, the gas pocket 140 has a vertical thickness less than that of the active layer 112. In yet another example embodiment, the gas pocket 140 has a vertical thickness greater than that of the active layer 112. In a more general sense, the gas pocket can be positioned laterally between the active layer 112 of adjacent transistor structures 110 in a number of configurations, and the degree to which the sidewalls of the adjacent active layers 112 and the sidewalls of the gas pocket 140 align can vary from one embodiment to the next.

In one specific example, the transistor structures 110 have a vertical height H of about 100 nm or less and a gap of about 100 nm or less. In some embodiments, the transistor structures 110 have a vertical height H from 25 to 100 nm. The isolation material 136 is formed or deposited with a layer thickness of about 2-5 nm along the sidewalls 138 and substrate 104. In some such embodiments, the gas pocket 140 has a horizontal size W of about 5 nm to 95 nm between the active layers 112 of adjacent transistor structures 110. Since air and other gases have a relative dielectric constant of about 1.0 (a.k.a. the relative permittivity), the gas pocket 140 behaves electrically like a vacuum. Accordingly, the relative dielectric constant of the gas pocket 140 dominates the resistivity of the gap between transistor structures 110. The result is that adjacent transistor structures 110 may benefit from reduced parasitic capacitance, reduced crosstalk, and/or a reduction in other undesirable effects relevant to device performance.

In some embodiments, the gas pocket 140 is at least partially encapsulated within isolation material 136. In some embodiments, the substrate 104 or other portions of the transistor structure 110 may define part of the boundary of the gas pocket 140. In FIG. 1 the gas pockets are illustrated as having a cross-sectional shape of a rectangle with rounded corners. Other shapes may result depending on the deposition method used to form the gas pocket 140. For example, the gas pocket may have a cross-sectional shape of a teardrop (i.e., a rounded bottom portion and tapering to a point at the top), a trapezoid, a rectangle, a circle, an oval, or other shapes. For example, the teardrop shape with a larger lower end portion and a tapered upper end portion may result due to pinching off of the isolation material 136 during deposition. Other shapes of the gas pocket 140 may result from different ratios of the gap height to gap width and deposition methods for isolation material 136, as will be appreciated. In some embodiments, the gas pocket 140 has a vertical height 140a at its tallest point of at least 5 nm, including at least 10 nm, at least 20 nm, at least 30 nm, at least 50 nm, or more. Generally, as the ratio increases of the vertical height 140a to width W of gas pocket, the gas pocket 140 may have a greater vertical height 140a. In some embodiments the aspect ratio the gap height to gap width is at least 1:2, such as from 1:2 to 1:1. In other embodiments, for example, the ratio of gap height to gap width is from 1:2 to 1:1, from 1:2 to 2:1, from 2:1 to 3:1, from 3:1 to 4:1, from 4:1 to 5:1, or greater than 5:1. Numerous variations and configurations will be apparent.

Figure 2:
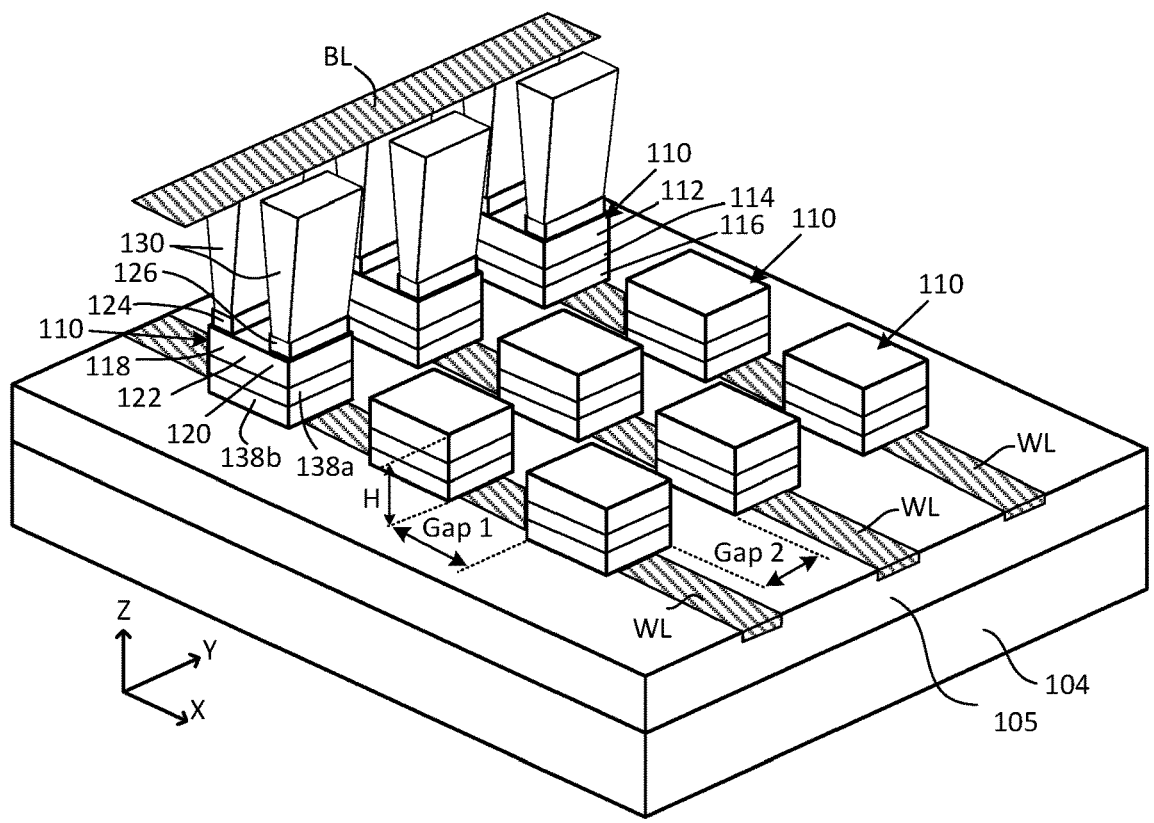
FIG. 2 illustrates a perspective view of an example array of transistor structures with wordlines and a bitline electrically coupled to electrodes on the transistor structures, in accordance with an embodiment of the present disclosure.

Referring now to FIG. 2, a perspective illustration shows an example array 106 of transistor structures 110 on substrate 104. As illustrated, the substrate 104 includes a layer of insulator material 105, such as an oxide, nitride, or other electrically insulating material. In one example, the array 106 is a memory structure, such as a bitcell array formed on the layer of insulator material 105. In other embodiments, the array 106 is some other arrangement of semiconductor devices in an integrated circuit. In some embodiments, the array 106 can be formed directly on the substrate 104, which may be a bulk semiconductor material, glass, alumina, sapphire, or other material.

In some embodiments, the array 106 includes rows and columns of spaced-apart transistor structures 110. In a given row (extending in the X-direction), adjacent transistor structures 110 are spaced by a first gap (Gap 1). Similarly, in a given column (extending in the Y-direction), adjacent transistor structures 110 are spaced by a second gap (Gap 2). In some embodiments, the first gap is the same size for all transistor structures in a given row and the second gap is the same size for all transistor structures in a given column. The first gap and the second gap can be the same or different size as measured horizontally in the X-direction and the Y-direction, respectively.

In this example, each transistor structure 110 includes a gate electrode 116, a dielectric layer 114 in contact with the gate electrode, and an active layer 112 spaced from the gate electrode 116 by the dielectric layer 114. The source electrode 124 and drain electrode 126 are on the active layer 112 in locations corresponding to the source region 118 and drain region 120, respectively. In some embodiments, the transistor structure 110 defines a three-dimensional rectangular block on the layer of insulator material 105. Other configurations of transistor structures 110 are acceptable as discussed in more detail below.

The transistor structures 110 in one row of the array 106 are illustrated in FIG. 2 to include examples of source electrodes 124, drain electrodes 126, and metal interconnect 130 similar to as shown in the cross-sectional view of FIG. 1. Metal interconnect 130 extends up from the source and drain electrodes 124, 126 and electrically connects the row of transistor devices 110 to a bitline BL. For example, the metal interconnect 130 extends up from the source electrode 124 to the bitline BL. The metal interconnect 130 of each transistor structure 110 extends up from the drain electrode 126 to a capacitor (not shown), as will be appreciated. Wordlines WL formed in the layer of insulator material 105 electrically connect the gate electrodes 116 of the transistor structures 110 in a given row. Although not illustrated, it is generally understood that each transistor structure 110, row, and column in the array 106 may include electrodes, connections, and/or other components, as will be appreciated.

The block shape of the transistor structure 110 has a vertical height H above the substrate material or field layer thereon (e.g., layer of insulator material 105), where H is 100 nm or less in some embodiments. In some embodiments, the vertical height H of the transistor structure 110 is equal to or greater than the horizontal dimension of the first gap and/or the second gap. For example, vertical height H is at least 100%, 120%, 140%, 160%, 180%, 200%, or some other amount of the first gap and/or the second gap. In other embodiments, vertical height H is less than the first gap and/or the second gap. For example, the vertical height H is 90% or more of the Gap 1 and/or Gap 2, 80% or more, 70% or more, 60% or more, or 50% or more of Gap 1 and/or Gap 2. In embodiments where Gap 1 is not equal to Gap 2, vertical height H can be from 50% to 200% of the first gap and from 50% to 200% of the second gap, including 50% to 150%, 70% to 130%, 80% to 120%, and 90% to 110%. In some embodiments, the vertical height H is within ±40% of the gap, including ±30%, ±20%, and ±10%. By adjusting the gap size and/or the aspect ratio of the gap, the horizontal and vertical size of the gas pocket 140 as well as the shape of the gas pocket 140 can be adjusted, as will be appreciated.

In some embodiments, a given transistor structure 110 may have different vertical heights H for different sidewalls 138. In such cases, the relevant vertical height H is the height of the sidewall 138 facing the gap between an adjacent transistor structure 110. In some embodiments, the vertical height H includes only the height H of a continuous, substantially vertical)(±5°) sidewall 138. In other embodiments, the vertical height H represents the height of the top surface of the transistor structure, even if the top surface is of a structure on a layer below it of larger area as viewed from above. In one example, the source and drain electrodes 124, 126 are formed prior to depositing the isolation material 136 between transistor structures 110. In some such embodiments, the relevant vertical height H of the sidewall 138a for the first gap in the X-direction includes the source or drain electrode 126 and the relevant vertical height H of the sidewall 138b is measured at the channel region 122 for the second gap in the Y-direction. In other embodiments, the transistor structure 110 is planarized to have sidewalls 138 with a consistent vertical height H.

Referring now to FIGS. 3A-3D, cross-sectional views illustrate examples of gas pockets 140 between active layers 112 of adjacent transistor structures 110. Note that the gas pocket 140 between these or other structures need not have a symmetrical shape in either a vertical or horizontal direction.

Figure 3A:
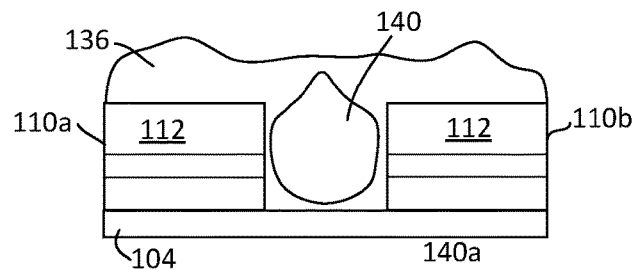
FIGS. 3A-3D illustrate cross-sectional views showing examples of airgaps or gas pockets between adjacent structures, in accordance with some embodiments of the present disclosure.

FIG. 3A illustrates two transistor structures 110a, 110b, each with an active layer 112 similar to the transistor structures 110 of FIG. 2. A layer of isolation material 136 is on the sidewalls and tops of the transistor structures 110a, 110b and encapsulates a gas pocket 140. In this example, the gas pocket 140 approximates a droplet shape with an upper portion that tapers to a point. In some embodiments, such as when the gas pocket 140 extends vertically above the top of the transistor structure as shown in FIG. 3A, chemical mechanical polishing may be used to planarize the isolation material 136, which may open the gas pocket at a level of the top surface of the active layer. The gas pocket may be re-closed by subsequently adding more isolation material, such as by chemical vapor deposition or other suitable process.

Figure 3B:
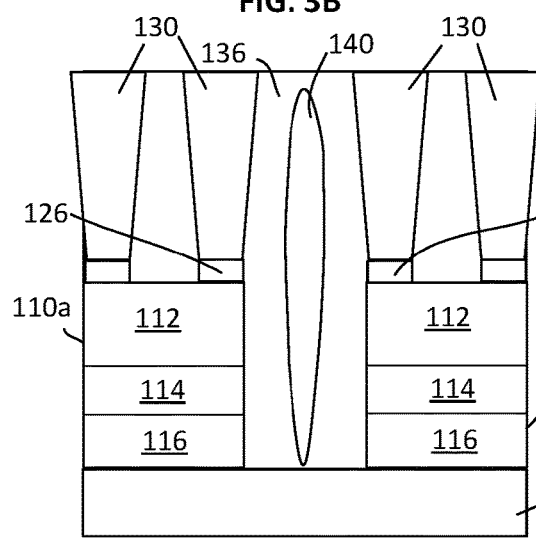

FIG. 3B illustrates an example of adjacent transistor structures 110a, 110b that each have an active layer 112, a dielectric layer 114, and a gate electrode 116 similar to transistor structures 110 of FIG. 2. A vertically elongated gas pocket 140 positioned between the transistor structures 110a, 110b in the isolation material 136. In this example, the gas pocket 140 has a vertical height greater than the vertical thickness of the active layer 112 of either transistor structure 110a, 110b. Accordingly, the gas pocket 140 extends above and below the active layer 112 of both transistor structures 110a, 110b. In some embodiments, the gas pocket 140 extends vertically above the active layer with part of the gas pocket 140 between the respective source contact 124 and drain contact 126 of adjacent transistor structures 110a, 110b. In this example, the gas pocket 140 has a greater vertical size such that at least part of the gas pocket 140 is positioned laterally between metal interconnects 130 on the respective source contact 124 and drain contact 126. Note that the gas pocket 140 may or may not extend to the base or substrate 104, and in some embodiments extends into the substrate 104. As previously explained, the vertical length or height of the gas pocket 140 as well as the degree of alignment with the adjacent layers 112 and other layers/features of the adjacent transistor structures can vary from one embodiment to the next.

Figure 3C:
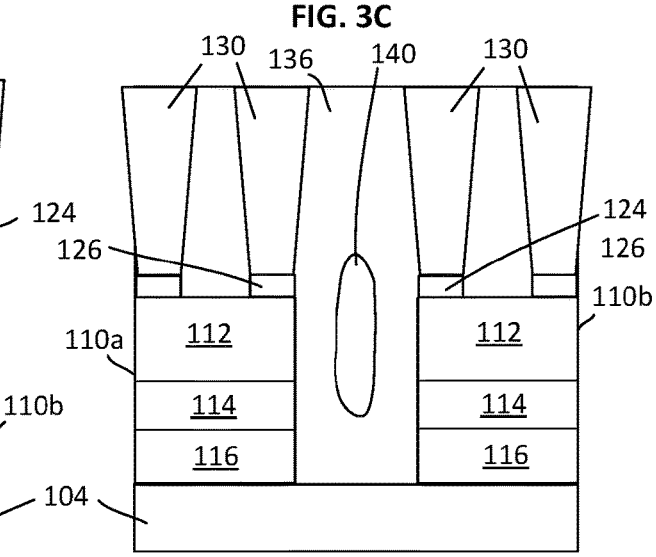

FIG. 3C illustrates another example of adjacent transistor structures 110a, 110b similar to those of FIG. 3B. In this example, the gas pocket 140 has a vertically elongated shape that is positioned between the active layers 112 of adjacent transistor structures 110a, 110b as well as between the metallization layer of the respective source contact 124 and drain contact 126. The gas pocket extends vertically above and below the active layers 112 of each transistor structure 110a, 110b and is encapsulated by the isolation material 136.

Figure 3D:
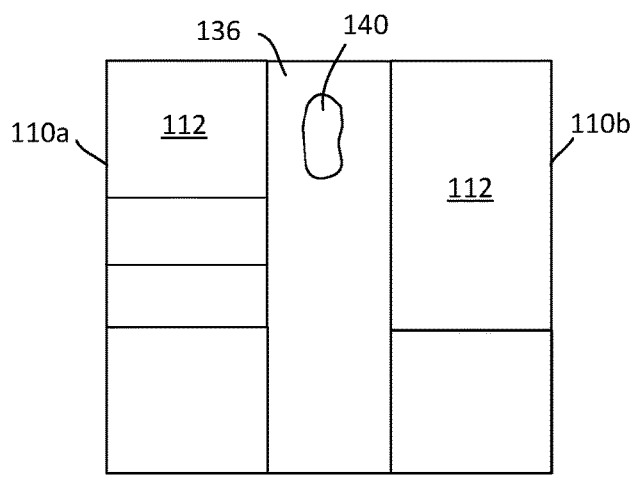

FIG. 3D illustrates a gas pocket 140 between the active layer 112 of adjacent transistor structures 110a, 110b. For ease of illustration, the complete transistor structures are not shown. In this example, the active layer 112 of transistor structure 110a has a vertical height that is smaller than that of the active layer 112 of transistor structure 110b. The gas pocket 140 is approximately centered laterally in the gap between the active layers 112 and is positioned vertically in the isolation material between the top and bottom of the active layer 112 of transistor structure 110a. Here, the gas pocket 140 has a shape that approximates a vertically elongated bubble.

Referring now to FIGS. 4A-4D, cross-sectional views show examples of transistor structures 110 between which a gas pocket 140 can be formed in accordance with some embodiments of the present disclosure. For convenience of illustration, various interlayer dielectric materials are not shown. Also, substrate 104 generally extends horizontally far beyond the active layer and other layers in an individual transistor structure 110 and can include tens, hundreds, thousands, millions, billions, or more devices. In some embodiments, all or part of the transistor structure 110 defines a three-dimensional rectangular block that includes the active layer 112. In an integrated circuit with a plurality of transistor structures 110, as shown for example in FIGS. 1-2, the transistor structures 110 can include one, two, or more different transistor structures 110 among the plurality of transistor structures 110. Many acceptable variations will be apparent in light of the present disclosure.

Figure 4A:
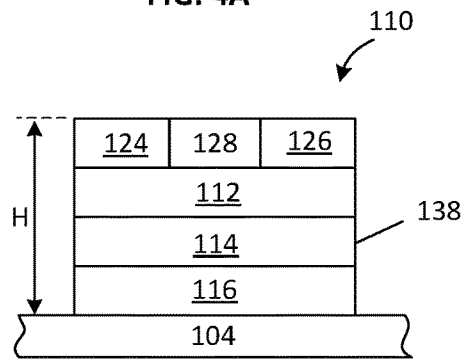
FIGS. 4A-4D illustrate cross-sectional views of example transistor structures that may be implemented in an integrated circuit that further includes airgaps or other gas pockets separating some of the transistor structures, in accordance with some embodiments of the present disclosure.

FIG. 4A illustrates a cross section of a thin-film transistor structure 110 with a bottom gate configuration similar to the transistor structures 110 shown in FIG. 1. The gate electrode 116 is on the substrate 104. The active layer 112 is over the gate electrode 116 and separated from the gate electrode 116 by the dielectric layer 114 (i.e., gate dielectric). The source electrode 124 and drain electrode 126 are on top of the active layer 112 with isolation material 128 between them. In such an embodiment, the sidewall 138 of the transistor structure 110 extends generally vertically from the substrate 104 and along the gate electrode 116, dielectric layer 114, and active layer 112. The gate electrode 116, dielectric layer 114, active layer 112, define a three-s dimensional rectangular block on the substrate 104. Depending on the configuration and methodologies used to define the source and drain electrodes, 124, 126, the rectangular bock may also include the source and drain electrodes 124, 126 and isolation material 128 between them. The vertical height H of the transistor structure 110 can be measured along the sidewall 138 that extends generally vertically from the substrate 104 to the top surface of the active layer 112, or to the top surface of the source and drain electrodes 124, 126.

Figure 4B:
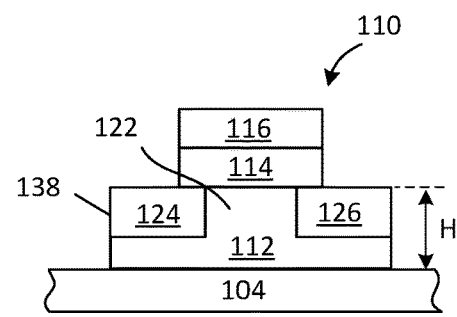

FIG. 4B illustrates an example of a thin-film transistor structure 110 with a top gate configuration. In this example structure, the active layer contacts the substrate 104. The source electrode 124 and drain electrode 126 contact opposite portions of the active layer 112 corresponding to the source region 118 and the drain region 120, respectively. The active layer 112 is recessed at the source and drain regions 118, 120 so that the top surfaces of the source electrode 124, drain electrode 126, and the channel region 122 of the active layer 112 are coplanar. The dielectric layer 114 is on top of the channel region 122 and portions of the source electrode 124 and drain electrode 126. The gate electrode 116 is on the dielectric layer 114 and aligned over the channel region 122 of the active layer 112. In such an embodiment, the transistor structure 110 may define a rectangular block with the active layer 112 and the source and drain electrodes 124, 126. Accordingly, the vertical height H can be measured along the sidewall 138 of the transistor structure 110 that extends up from the substrate 104 generally vertically along the active layer 112 to the top surface of the source and drain electrodes 124, 126. In some embodiments, the sidewall 138 may be continuous from the substrate 104 to the top surface of the dielectric layer 114 or gate electrode 116. In such embodiments, the vertical height H may include such layer(s).

In some embodiments, the rectangular block shape includes the dielectric layer 114, and in other embodiments, also includes the gate electrode 116. For example, the dielectric layer 114 in some embodiments extends across the entire top surface defined by the active layer 112 and the source and drain electrodes 124, 126 such that the vertically extending sidewall 138 includes the dielectric layer 114. Similarly, in yet other embodiments, both the dielectric layer 114 and the gate electrode 116 have the same general size and shape as the active layer 112 as viewed from above, such that the vertically extending sidewall 138 includes these layers.

Figure 4C:
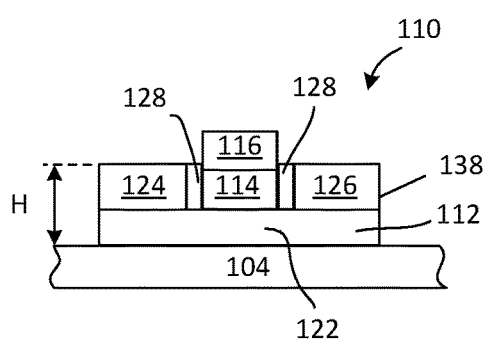

FIG. 4C illustrates another example of a thin-film transistor structure 110 with a top gate configuration. In this example structure, the active layer contacts the substrate 104 and has a generally planar top surface. The source electrode 124 and drain electrode 126 are on the top of the active layer 112 in spaced-apart locations corresponding to the source region 118 and drain region 120, respectively. The gate structure is formed on the channel region 122 and includes the dielectric layer 114 in contact with the top surface of the active layer 112 between the source electrode 124 and the drain electrode 126. The gate electrode 116 is on the dielectric layer 114 and aligned over the channel region 122 of the active layer 112. The gate electrode 116 and dielectric layer 114 are spaced from the source electrode 124 and drain electrode 126 by spacers 128 of isolation material. The active layer 112, the source and drain electrodes 124, 126, and the spacers 128 define a three-dimensional rectangular block on the substrate 104. The vertical height H can be measured along the sidewall 138 of the transistor structure 110 that extends up from the substrate 104 generally vertically along the active layer 112 to the top surface of the source and drain electrodes 124, 126.

Figure 4D:
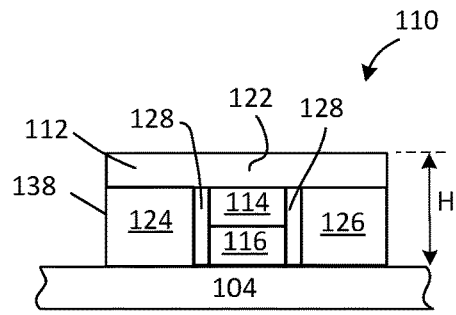

FIG. 4D is another embodiment of a thin-film transistor structure 110 with a bottom gate configuration. The source and drain electrodes 124, 126 are on the substrate 104 in a spaced-apart relationship. The gate structure, which includes the gate electrode 116, dielectric layer 114 and spacers 128, is positioned between the source and drain electrodes 124, 126. The dielectric layer 114 is on top of the gate electrode 116, which is in contact with the substrate 104. The spacers 128 are between the gate electrode 116 and each of the source electrode 124 and drain electrode 126, where the spacer 128 extends vertically along the gate electrode 116 and dielectric layer 114. The top surfaces of the source electrode 124, drain electrode 126, and gate structure are coplanar. The active layer 112 is on this coplanar surface in contact with the source and drain electrodes 124, 126 and dielectric layer 114. The channel region 122 of the active layer 112 is aligned over and spaced from the gate electrode 116 by the dielectric layer 114 (i.e., gate dielectric). In this embodiment, the source and drain electrodes, 124, 126, the gate structure, and the active layer 112 define a rectangular block on the substrate 104. Accordingly, the vertical height H can be measured along the sidewall 138 that extends generally vertically upward from the substrate 104 to the top surface of the active layer 112.

In some embodiments, the substrate 104 is a bulk semiconductor, a layer of semiconducting material on a support structure, or an insulating support substrate, for example. In some embodiments, the substrate comprises alumina ($Al_2O_3$), sapphire, glass, a high-K dielectric, or other insulating material. In other embodiments, the substrate includes a bulk semiconductor comprising silicon, germanium, silicon germanium, gallium arsenide, indium arsenide, gallium antimonide, indium gallium, arsenide, silicon carbide, or other group IV or group III-V material. In some embodiments, the substrate 104 includes a semiconductor material with a layer of insulator material 105 on a top surface, such as an oxide or nitride layer formed on silicon. Such embodiments may be used, for example, when the transistor structure 110 is a thin-film transistor formed on a substrate 104 that also includes other semiconductor devices.

The layer of insulator material 105 on the substrate 104 can include one or more of silicon dioxide, silicon nitride, aluminum oxide, gallium oxide, titanium dioxide, hafnium dioxide, silicon oxynitride, aluminum silicate, tantalum oxide, hafnium tantalum oxide, aluminum nitride, aluminum silicon nitride, sialon, zirconium dioxide, hafnium zirconium oxide, tantalum silicate, and hafnium silicate, to name a few examples. Suitable materials for interlayer dielectric layers include aluminum oxide ($Al_2O_3$), hafnium oxide ($HfO_2$), silicon nitride (SiN), silicon dioxide ($SiO_2$), and carbon-doped silicon dioxide ($SiO_2$:C), to name a few examples.

In some embodiments, the isolation material 136 in the gap between transistor structures 110 has a vertical thickness of 100 nm or less, including 75 nm or less, 50 nm or less, 20 nm or less. In some embodiments, the isolation material 136 has a thickness between a sidewall 138 and the gas pocket of 10 nm or less, 5 nm or less, or from 2 nm to 5 nm. The isolation material 136 is an electrical insulator, such as aluminum oxide ($Al_2O_3$), hafnium oxide ($HfO_2$), silicon nitride (SiN), silicon dioxide ($SiO_2$), Silicon oxynitride (SiON), aluminum oxynitride (AlON), aluminum nitride (AlN), hafnium lanthanum oxide (HfLaOx), lanthanum oxide ($La_2O_3$), and tantalum oxide ($TaO_5$), to name a few examples. In some embodiments, the isolation material 136 in the gap between transistor structures 110 is a high-κ dielectric having a relative dielectric constant above 3.9 (the relative dielectric constant for SiO$_2$). The isolation material 136 may be deposited using atomic layer deposition (ALD), chemical vapor deposition (CVD), a combination of physical vapor deposition (PVD) and CVD, a combination of PVD and ALD, or other suitable process, as will be appreciated.

In some embodiments, the isolation material 136 in the gap between adjacent transistor structures 110 can be two or more dissimilar materials. In one example, a first isolation material 136 is in the first gap (gap 1) and a second isolation material 136 is in the second gap (gap 2). A gas pocket 140 is created when the ALD/CVD coverage on the edge of a transistor structure 110 connects with or closes on the ALD/CVD layer of the adjacent transistor structure 110 before the gap fills with the isolation material 136, thus encapsulating the gas pocket 140. In some embodiments, the gas pocket 140 has a cross-sectional shape of a droplet or keyhole. In other embodiments, the gas pocket 140 has a narrow top and bottom portion compared to a middle portion as viewed in a cross-sectional view.

The gate electrode 116 may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

The dielectric layer 114 (i.e., gate dielectric) can be any suitable gate dielectric material such as silicon dioxide (SiO$_2$) or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used. In some embodiments, the gate dielectric has a vertical thickness from 2 nm to 10 nm, including 4-7 nm.

In some embodiments, the gate dielectric 114 and/or gate electrode 116 may include a multilayer structure of two or more material layers or components. For instance, in one such embodiment, the gate dielectric 114 is a bi-layer structure having a first dielectric material (e.g., silicon dioxide) in contact with the active layer 112 and a second dielectric material (e.g., hafnium oxide) in contact with the first dielectric material, the first dielectric material having a dielectric constant that is lower than the dielectric constant of the second dielectric material. Likewise, the gate electrode structure 116 may include a central metal plug portion (e.g., tungsten) with one or more outer work function layers and/or barrier layers (e.g., tantalum, tantalum nitride), and/or a resistance reducing cap layer (e.g., copper, gold). In some embodiments, the gate dielectric 114 and/or gate electrode 116 may include grading (increasing or decreasing, as the case may be) of the concentration of one or more materials therein. Numerous different gate structure configurations can be used, as will be appreciated.

Examples of suitable material for the spacer 128 and for isolation material between the source electrode 124 and the drain electrode 126 include electrically insulative materials such as aluminum oxide (Al$_2$O$_3$), silicon nitride (SiN), hafnium oxide (HfO$_2$), silicon aluminum oxide (SiAlO), hafnium silicon oxide (HfSiO), hafnium aluminum oxide (HfAlO), titanium dioxide (TiO$_2$), tantalum oxide (Ta$_2$O$_5$), hafnium tantalum oxide (HMO), aluminum tantalum oxide (AlTaO), aluminum nitride (AlN), silicon dioxide (SiO$_2$), and carbon-doped silicon dioxide (SiO$_2$:C) to name a few examples. In some embodiments, spacer 128 can be a low-k material, such as porous SiO$_2$.

In some embodiments, the active layer 112 has a vertical thickness is from 10 nm to 80 nm, including 10 nm to 50 nm. The active layer can be formed in a backend process, for example, from one or more of indium gallium zinc oxide (IGZO), indium zinc oxide (IZO), amorphous silicon (a-Si), low-temperature polycrystalline silicon (LTPS), and amorphous germanium (a-Ge). The active layer of the transistor structure 110 can be a semiconductor material with a single-crystal, polycrystalline, or amorphous structure, in accordance with some embodiments. For example, in some embodiments, the active layer is amorphous semiconductor material, such as hydrogenated amorphous silicon (a-Si:H), polysilicon, zinc oxide (ZnO), indium gallium zinc oxide (IGZO), indium-zinc oxide (IZO), indium-molybdenum oxide (IMO), or zinc-tin oxide (ZTO) to name a few examples. In other embodiments, the active layer can be any one of a variety of polycrystalline semiconductors including, for example, zinc oxynitride (ZnON, such as a composite of zinc oxide (ZnO) and zinc nitride (Zn$_3$N$_2$), or of ZnO, ZnO$_x$N$_y$, and Zn$_3$N$_2$), indium tin oxide (ITO), tin oxide (e.g., SnO), copper oxide (e.g., Cu$_2$O), polycrystalline germanium (poly-Ge) silicon-germanium (e.g., SiGe, such as Si$_{1-x}$Ge$_x$) structures (such as a stack of poly-Ge over SiGe), and the like. In yet other embodiments, the active layer comprises a conductive oxide, such as magnesium zinc oxide (MgZnO).

In some embodiments, the active layer 112 is formed from a material of a first conductivity type, which may be an n-type or a p-type semiconductor material. An n-type active layer material may include one or more of indium tin oxide (ITO), indium gallium zinc oxide (IGZO), indium zinc oxide (IZO), aluminum-doped zinc oxide (AZO), amorphous silicon, zinc oxide, amorphous germanium, polysilicon, poly germanium, and poly-III-V like indium arsenide (e.g., InAs). On the other hand, a p-type active layer material may include one or more of amorphous silicon (a-Si), zinc oxide (e.g., ZnO), amorphous germanium (a-Ge), polysilicon (polycrystalline silicon or poly-Si), poly germanium (polycrystalline germanium or poly-Ge), poly-III-V (e.g., InAs), copper oxide (CuO), and tin oxide (SnO).

Figure 5:
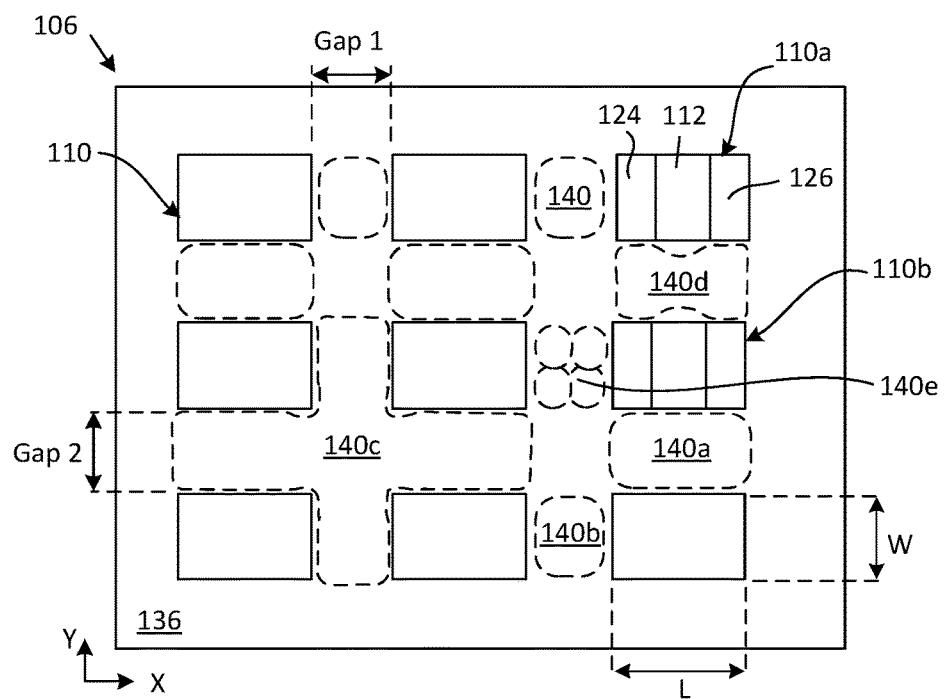
FIG. 5 illustrates a top plan view of an example array of transistor structures and examples of various geometries for airgaps or other gas pockets between adjacent transistor structures, in accordance with some embodiments of the present disclosure.

Referring now to FIG. 5, a top plan view illustrates an array 106 of transistor structures 110 and various examples of the geometry of the gas pocket 140 between adjacent transistor structures 110. Example transistor structures 110a, 110b are shown with a source electrode 124 and a drain electrode 126 on the active layer 112. Other transistor structures 110 are illustrated as having a planarized top surface, such as the top surface of active layer 112. A gas pocket 140 is encapsulated by the isolation material 136 between adjacent transistor structures 110. The shape and size of individual gas pockets 140 are shown as examples, but the actual shape may be different. Also, gas pockets 140 within an array 106 generally will have a consistent geometry due to the consistency of the geometry of elements in the array 106. Accordingly, array 106 of FIG. 4 is an atypical example with gas pockets 140 of various different geometries.

In one example, gas pocket 140a has an elongated shape as viewed from above since it is positioned between transistor structures 110 having a horizontal dimension (e.g., length L) that is greater than the distance between transistor structures 110. Similarly, the gas pocket 140b along a transistor structure having a horizontal dimension (e.g., width W) that is the same or about the same as the size of the gap may result in a gas pocket 140b having a more uniform shape as viewed from above. In some instances, gas pocket 140*b* has a generally spherical or generally cubic geometry. In another example, the ratio of the vertical height H to the first gap and the ratio of the vertical height H to the second gap is selected so that the gas pocket 140*c* extends between more than two adjacent transistor structures 110. In one such example, the gas pocket 140*c* may define a plus shape between four neighboring transistor structures 110 as the result of the transistor structures 110 being sufficiently close together that the isolation material 136 closes on itself during deposition to encapsulate gas (e.g., air) with such a shape. In yet other examples, a gas pocket 140*d* may have a bone shape, a bowtie shape, or other irregular shape when formed between adjacent transistor structures 110 having opposed sidewalls 138 with an inconsistent vertical height H. In yet other examples, the gas pocket 140*e* between adjacent transistor structures 110 may include a plurality of distinct or connected gas pockets that, when aggregated, result in the gap having a relative dielectric constant of approximately 1.0 (a.k.a. relative permittivity, $\varepsilon_r$).

Figure 6:
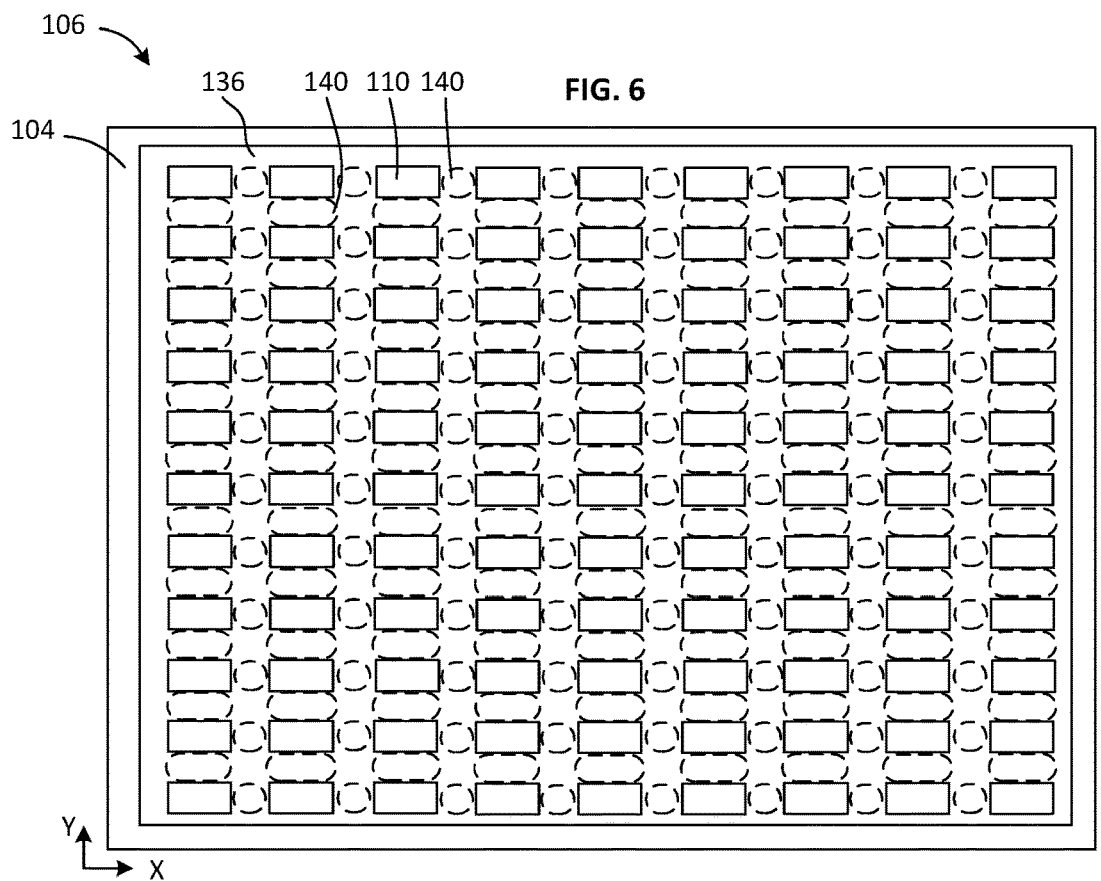
FIG. 6 illustrates a top plan view of an example array of transistor structures with an airgap or other gas pocket between adjacent transistor structures in each row and column, in accordance with an embodiment of the present disclosure.
Figure 7:
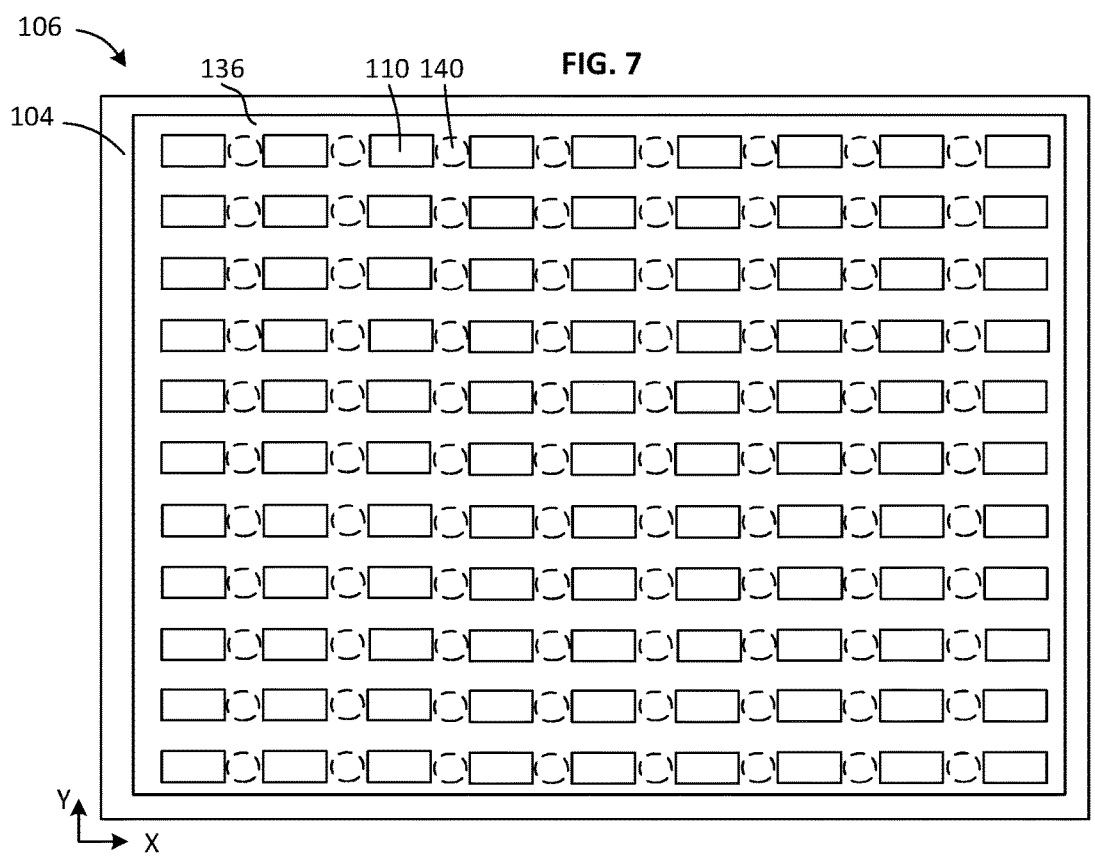
FIG. 7 illustrates a top plan view of an example array of transistor structure with an airgap or other gas pocket between adjacent transistor structures in rows, but absent in columns of transistor structures, in accordance with an embodiment of the present disclosure. It will be appreciated that the gas pockets could similarly be present between adjacent transistor structures in columns, but absent in rows of transistor structures.

Referring now to FIGS. 6 and 7, top plan views illustrate example arrays 106 of transistor structures 110 with a gas pocket 140 between adjacent transistor structures. In FIG. 6, a gas pocket 140 is located between adjacent transistor structures 110 in both the X-direction and Y-direction. In the array 106 of FIG. 7, a gas pocket 140 is located between adjacent transistor structures 110 in the X-direction only. In other embodiments of array 106, a gas pocket 140 is located between adjacent transistor structures 110 in the Y-direction only. Gas pockets 140 are evenly spaced and are generally centered (e.g., ±5 nm) between adjacent transistor structures 110. In some embodiments, the gas pocket 140 occupies at least 10% of the volume between adjacent transistor structures, including at least 25%, at least 40%, at least 50%, at least 60%, at least 70%, at least 80% and at least 90%. For example, the volume between adjacent transistor structures 110 can be determined by the volume as bounded by sidewalls 138 of adjacent transistor structures 110 facing each other, the substrate 104, the top surface of the transistor structures, and the imaginary planes extending between coplanar sidewalls 138 of adjacent transistor structures 110. In some embodiments, the gas pocket 140 has a volume of at least 5 nm$^3$, including at least 10 nm$^3$, at least 50 nm$^3$, at least 200 nm$^3$, at least 1000 nm$^3$, or more.

In some embodiments, the relative permittivity of the volume between adjacent transistor structures 110, including isolation material 136 and gas pocket 140, is less than 3.6, including less than 3.0, less than 2.5, less than 2.0, less than 1.5, less than 1.3, less than 1.2, less than 1.1, and less than 1.05.

In some embodiments, the array 106 includes a gas pocket 140 between adjacent transistor structures 110 in at least 90% of the gaps between adjacent transistor structure pairs in rows (the X-direction, in columns (the Y-direction), or in both columns and rows. In some embodiments, a gas pocket 140 is present in at least 95%, at least 99%, or at least 99.9% of gaps in rows, in columns, or both rows and columns.

Fabrication

Figure 8:
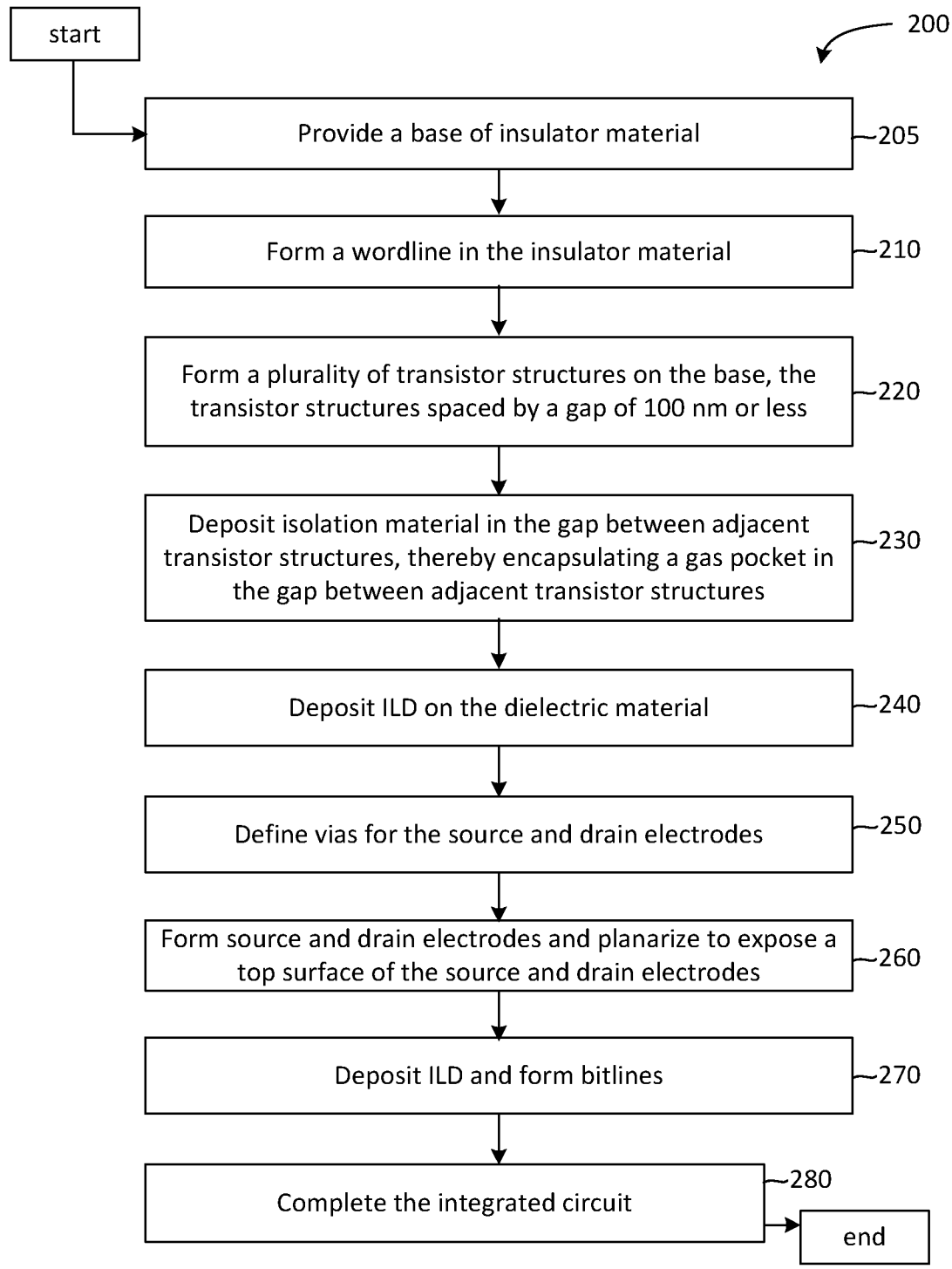
FIG. 8 illustrates processes in a method of fabricating an integrated circuit, in accordance with an embodiment of the present disclosure.

Referring now to FIG. 8, a flow chart illustrates processes in a method 200 of fabricating an integrated circuit in accordance with some embodiments of the present disclosure.

In general, integrated circuits according to the present disclosure can be fabricated using any suitable semiconductor fabrication techniques, including photolithography, wet or dry chemical etching processes, chemical mechanical polishing, deposition or epitaxial growth processes (e.g., CVD, PVD, ALD, VPE, MBE, LPE), melt regrowth, and/or any other suitable processing, as will be appreciated. In some embodiments, the components of the integrated circuit can be part of a backend process, such as the back end of line (BEOL) process of a semiconductor integrated circuit. As such, components of the integrated circuit can be fabricated as part of, or concurrently with, metal interconnection layers. In other embodiments, transistor structures 110 are fabricated on the substrate 104 as part of a front end of line (FEOL) process. In example embodiments, depositing an isolation material 136 with encapsulated gas pockets 140 can be performed after forming at least part of the transistor structures 110. For example, the isolation material 136 is a dielectric that is deposited between and on transistor structures 110 that are formed by depositing the semiconductor material of the active layer 112 and performing additional processing as needed. In some embodiments, the isolation material 136 may be deposited before or after formation of the source electrode 124 and drain electrode 126.

In one embodiment, method 200 begins by providing 205 a substrate that is or includes a base of electrically insulating material. In some embodiments, the base includes one or more layers of insulator material, such as silicon dioxide ($SiO_2$), silicon nitride ($Si_3N_4$), or other electrically insulating material formed on a substrate. In some embodiments, the substrate includes a bulk semiconductor with a layer of insulator material. In one example, the substrate comprises alumina ($Al_2O_3$), sapphire, glass, a high-K dielectric material, or other insulating material. In other embodiments, the substrate includes a layer of insulator material formed on bulk semiconductor material comprising silicon, germanium, silicon germanium, gallium arsenide, indium arsenide, gallium antimonide, indium gallium, arsenide, silicon carbide, or other group IV or group III-V material. In one specific embodiment, the substrate includes bulk silicon and a layer of silicon oxide or silicon nitride formed or deposited on the silicon. Some such embodiments may be used when the transistor structure is (or will be) a thin-film transistor formed on a substrate that also includes other semiconductor devices, for example.

The insulating base material can include one or more of silicon dioxide, silicon nitride, aluminum oxide, gallium oxide, titanium dioxide, hafnium dioxide, silicon oxynitride, aluminum silicate, tantalum oxide, hafnium tantalum oxide, aluminum nitride, aluminum silicon nitride, sialon, zirconium dioxide, hafnium zirconium oxide, tantalum silicate, and hafnium silicate, to name a few examples. Suitable materials for this and other interlayer dielectric (ILD) layers include aluminum oxide ($Al_2O_3$), hafnium oxide ($HfO_2$), silicon nitride (SiN), silicon dioxide ($SiO_2$), and carbon-doped silicon dioxide ($SiO_2$:C), to name a few examples.

Method 200 continues with forming 210 one or more wordlines in the insulating base. Process 210 may be performed, for example, by patterning and etching the layer of insulating material to define a trench, followed by depositing metal interconnect material in the trench, such as copper, aluminum, or tungsten. The structure can be planarized as needed so that the top surface of the wordline is coplanar with the top surface of the layer of insulating material.

In some embodiments, forming 210 wordlines includes forming via plugs to connect the wordlines to other layers in the integrated circuit structure. For example, a layer of etch stop material is deposited on the insulating base and the wordlines, followed by forming wordline vias that extend through the etch stop material to the wordlines. Metal interconnect is deposited in the wordline vias to define via plugs that electrically connect the wordline to a gate electrode subsequently formed on top of the etch stop material, for example. In some embodiments, wordline vias are defined when the etch-stop material is deposited, such as by masking off regions that will become wordline vias and removing the mask after depositing the etch-stop material. In other embodiments, the etch-stop material is deposited as a blanket layer followed by defining wordline vias in the etch-stop material corresponding to desired locations on the wordline. For example, a hardmask is deposited on the etch-stop material, patterned to define the wordline vias, and then etched to open the wordline vias in the etch-stop layer. Other additional processing may be performed as needed, such as cleaning the underlying wordline after opening the wordline vias, and planarizing the structure by chemical mechanical polishing (CMP) so that the top surface of the via plugs is coplanar with the top surface of the etch-stop material.

Method 200 continues with forming 220 a plurality of transistor structures on the insulating base. In one example embodiment, the transistor structure is a bottom-gate, thin-film transistors that are the same as or similar to the transistor structure illustrated in FIG. 4A. In some such embodiments, blanket layers of gate electrode material, dielectric material, and active layer material are deposited on the substrate and form the basis for a plurality of thin-film transistors. For example, the gate electrode material is deposited on the base, the layer of dielectric material is then deposited on the gate electrode, and the active layer material is then deposited on the layer of dielectric material. Optionally, a layer of isolation material is deposited or formed on top of the active layer material.

The blanket layers are then patterned and etched to define a plurality of transistor structures that may appear as "islands" formed on and extending up from the base material. For example, an etch mask is formed on top of the active layer material and patterned to define the geometry of the transistor structure, followed by etching through the surrounding blanket layer materials to the etch-stop material. The etching can be any suitable wet or dry etch process, or combination of such processes. In one embodiment, an anisotropic etch is used. In some embodiments, a combination of anisotropic etch and isotropic etch processes may be used. For example, 70-80% the etch is performed with an anisotropic etch process followed by an isotropic etch process for the remainder of the etch. Other variations will be appreciated in light of the present disclosure.

The gate electrode layer may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

The layer of dielectric material, which will become the gate dielectric, can be silicon dioxide ($SiO_2$) or a high-K dielectric material such as hafnium dioxide ($HfO_2$), silicon nitride (e.g., $Si_3N_4$), or other high-K material, for example. In some embodiments, the dielectric material is a multilayer stack including, for example, a first layer of $SiO_2$ and a second layer of a high-K dielectric, such as $HfO_2$, formed on the layer of $SiO_2$. Any number of suitable dielectric materials can be used, as will be appreciated in light of the present disclosure. In some embodiments, the layer of dielectric material 114 has a thickness in a range from 2 nm to 10 nm, including 4-7 nm.

In some embodiments, the material of the active layer has a thickness is from 10 nm to 80 nm, including 10 nm to 50 nm. The active layer can be formed in a backend process, for example, from one or more of indium gallium zinc oxide (IGZO), indium zinc oxide (IZO), amorphous silicon (a-Si), low-temperature polycrystalline silicon (LTPS), and amorphous germanium (a-Ge). The active layer can be a semiconductor material with a single-crystal, polycrystalline, or amorphous structure, in accordance with some embodiments. For example, in some embodiments, the active layer includes amorphous semiconductor material, such as hydrogenated amorphous silicon (a-Si:H), polysilicon, zinc oxide (ZnO), indium gallium zinc oxide (IGZO), indium-zinc oxide (IZO), indium-molybdenum oxide (IMO), or zinc-tin oxide (ZTO) to name a few examples. In other embodiments, the active layer material can include any one or more of a variety of polycrystalline semiconductors including, for example, zinc oxynitride (ZnON, such as a composite of zinc oxide (ZnO) and zinc nitride ($Zn_3N_2$), or of ZnO, $ZnO_xN_y$, and $Zn_3N_2$), indium tin oxide (ITO), tin oxide (e.g., SnO), copper oxide (e.g., $Cu_2O$), polycrystalline germanium (poly-Ge) silicon-germanium (e.g., SiGe, such as $Si_{1-x}Ge_x$) structures (such as a stack of poly-Ge over SiGe), and the like. In yet other embodiments, the active layer material comprises a conductive oxide, such as magnesium zinc oxide (MgZnO).

In some embodiments, the active layer material has a first conductivity type, which may be an n-type or a p-type semiconductor material. An n-type active layer material may include one or more of indium tin oxide (ITO), indium gallium zinc oxide (IGZO), indium zinc oxide (IZO), aluminum-doped zinc oxide (AZO), amorphous silicon, zinc oxide, amorphous germanium, polysilicon, poly germanium, and poly-III-V like indium arsenide (e.g., InAs). On the other hand, a p-type active layer material may include one or more of amorphous silicon (a-Si), zinc oxide (e.g., ZnO), amorphous germanium (a-Ge), polysilicon (polycrystalline silicon or poly-Si), poly germanium (polycrystalline germanium or poly-Ge), poly-III-V (e.g., InAs), copper oxide (CuO), and tin oxide (SnO).

Method 200 continues with depositing 230 isolation material between the transistor structures and encapsulating gas pockets in the isolation material between adjacent transistor structures. In one embodiment, the isolation material is deposited using a combination of atomic layer deposition (ALD) and chemical vapor deposition (CVD). In other embodiments, the isolation material is deposited using a combination of physical vapor deposition (PVD) and CVD or a combination of PVD and ALD. In one example, the isolation material forms first on sidewalls of the transistor structures and on the base layer between the transistor structures. As additional isolation material is deposited, the material closes on itself or pinches off to encapsulate a quantity of gas (e.g., air) in the gap between adjacent transistor structures. In one embodiment, depositing 230 isolation material includes depositing a first isolation material in a first direction (e.g., X-direction) between adjacent transistor structures, followed by depositing a second isolation material in a second direction (e.g., Y-direction) between adjacent transistor structures. Such a process that includes first and second isolation materials may include a series of masking and etching to define the regions in which a given isolation material will be deposited, as will be appreciated. After depositing the isolation material, the structure is planarized as needed. For example, planarizing the structure reveals the top surface of the transistor structure, such as the top surface of the active layer.

The isolation material formed in the gap between the transistor structures may have a vertical thickness from 50 nm to 500 nm in some embodiments. In some embodiments, the isolation material has a thickness that far exceeds the vertical height H of the transistor structures, such as when the isolation material is planarized after deposition. In other embodiments, the isolation material is deposited with a thickness commensurate with the vertical height H. Examples of the isolation material include aluminum oxide ($Al_2O_3$), hafnium oxide ($HfO_2$), silicon nitride (SiN), silicon dioxide ($SiO_2$), and carbon-doped silicon dioxide ($SiO_2$:C), to name a few examples. In some embodiments, the isolation material is a high-K dielectric having a relative dielectric constant above 3.9 (the relative dielectric constant for $SiO_2$).

Method 200 continues with depositing 240 an interlayer dielectric (ILD) layer on top of the isolation material. In some embodiments, the ILD material and isolation material are selected for etch selectivity between the materials. For example, when the isolation material is aluminum oxide, the ILD layer is silicon nitride. In another example, when the ILD material is hafnium oxide, the isolation material is aluminum oxide. Such a combination of isolation material and ILD material results in the isolation material being minimally affected when etching through the ILD layer to open vias for formation of the source and drain electrodes. Other suitable material combinations will be apparent in light of the present disclosure. By selecting the isolation material and ILD material in this way, for example, vias for the source and drain electrodes that extend beyond the boundary of the transistor structure (e.g., due to mask misalignment), will not result in the vias that inadvertently open the gas pockets encapsulated by the isolation material.

Method 200 continues with defining 250 source/drain (S/D) electrode vias in the ILD layer, where the vias are aligned over and expose the source and drain regions of the active layer. Process 250 can be performed, for example, using lithography. For example, a mask layer is applied on the ILD layer and patterned. The mask is aligned to position of the source and drain electrodes on the source and drain regions of the active layer. Vias are opened in the ILD layer using a wet or dry etch process, for example.

Method 200 continues with depositing 260 the source and drain electrode metals (or metallic oxide) and planarizing the metallized structure to remove excess metal from the top of the ILD layer. The planarization can be performed using chemical mechanical polishing, for example. Example electrode metals include copper (Cu), tungsten (W), titanium oxynitride (e.g., $TiO_xN_y$ with x>0 and y>0), titanium (Ti), tantalum (Ta), tantalum nitride (e.g., TaN), aluminum titanium nitride (e.g., $AlTi_xN_y$ with 0<x<1 and y>0), indium titanium oxide (ITO), indium oxide (InO), indium zinc oxide (IZO), or reduced indium gallium zinc oxide (IGZO), to name a few. In some embodiments, the source and drain electrodes may be metal, such as copper interconnect, formed by a damascene process using chemical mechanical planarization (CMP). In another embodiment, the source and drain electrodes can be formed, for example, by contact etching the material of the source and drain regions of the active layer. In some embodiments, a contact metal is annealed, etched, or otherwise formed on or combined with the tops of the source and drain regions of the active layer. For example, a silicide or other appropriate compound, depending on the contact metal, is formed as a contact on the active layer.

Method 200 continues by depositing 270 a layer of ILD material on top of the planarized TFT structure and forming metal bitlines in contact with the source and drain electrodes. For example, the metal bitlines are formed with a metal interconnect material, such as copper, aluminum, or tungsten, then planarized to be coplanar with the top surface of the ILD layer.

Method 200 continues by completing 280 an integrated circuit implementing the transistor structures, such as formation of a memory cells with thin-film transistors, and additional processing as needed to incorporate the memory cells in a memory array. Although method 200 is discussed above as an example series of operations or stages, it is to be understood that there is no required order to the operations or stages unless specifically indicated. For example, processing the source and drain electrodes may occur before or after depositing isolation materials in the gap between the transistor structures. Numerous variations as will be apparent in light of the present disclosure.

Example System

Figure 9:
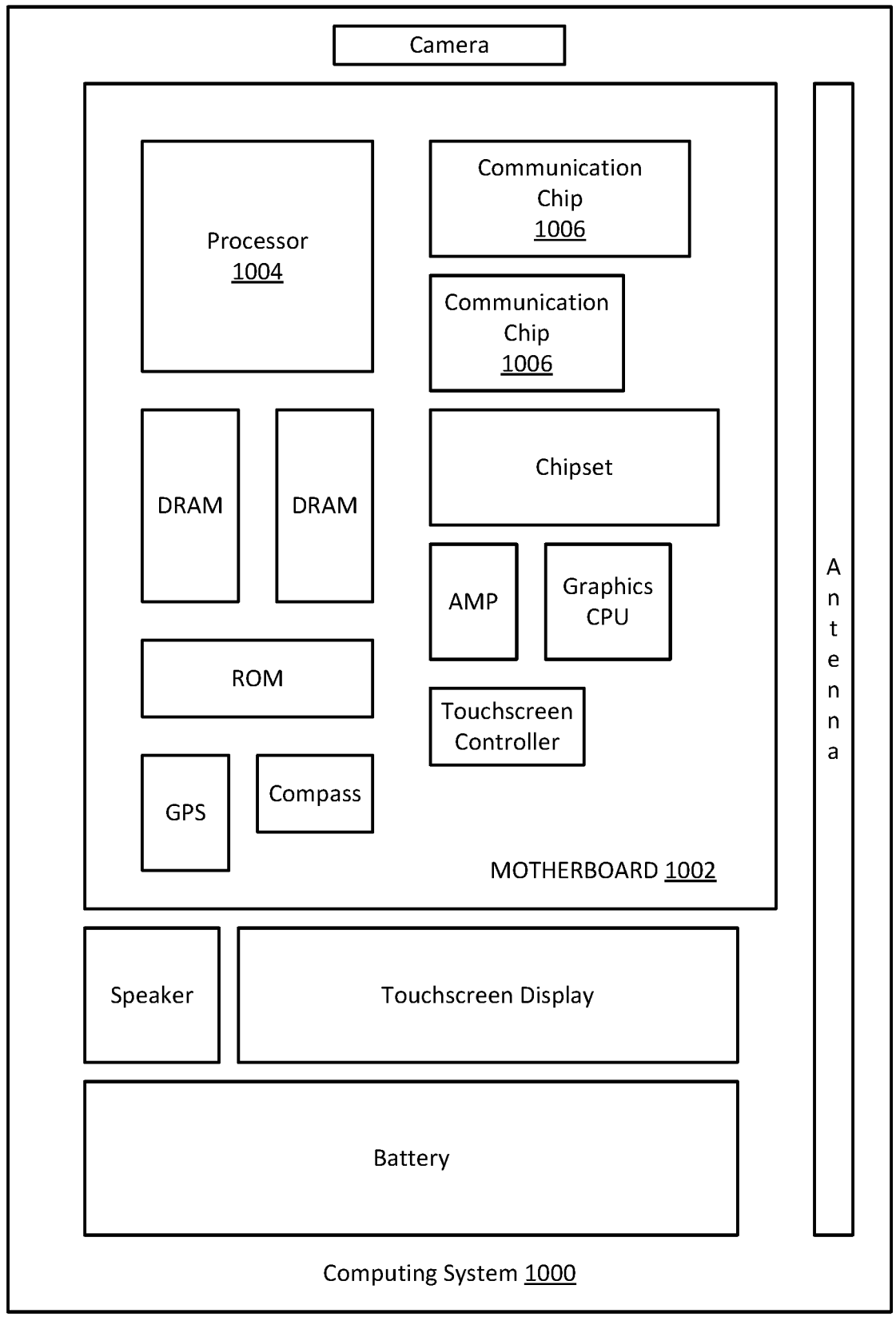
FIG. 9 illustrates a diagram of an example computing system implementing an integrated circuit or transistor structures of the present disclosure, in accordance with some embodiments.

FIG. 9 illustrates a computing system 1000 implemented with the integrated circuit structures or techniques disclosed herein, according to an embodiment of the present disclosure. As can be seen, the computing system 1000 houses a motherboard 1002. The motherboard 1002 may include a number of components, including, but not limited to, a processor 1004 (including embedded memory (e.g., eDRAM) incorporating thin-film transistors as described herein) and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, to name a few examples.

Depending on its applications, computing system 1000 may include one or more other components that may or may not be physically and electrically coupled to the motherboard 1002. These other components may include, but are not limited to, volatile memory (e.g., dynamic random-access memory (DRAM)), nonvolatile memory (e.g., read-only memory (ROM), resistive random-access memory (RRAM), and the like), a graphics processor, a digital signal processor, a crypto (or cryptographic) processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices (e.g., one or more memory cells, one or more memory cell arrays) formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, and the like that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, millimeter wave, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., one or more memory cells) formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices (e.g., one or more memory cells) formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., one or more memory cells) formed using the disclosed techniques, as variously described herein.

Further Example Embodiments

The following examples pertain to further embodiments, from which numerous permutations and configurations will be apparent.

Example 1 is an integrated circuit comprising: a first transistor structure; a second transistor structure, the second transistor structure spaced from the first transistor structure; and an insulator material at least partially encapsulating a gas pocket laterally between the first transistor structure and the second transistor structure. For example, an imaginary plane passes through a portion of the first transistor structure, a portion of the second transistor structure, and the gas pocket.

Example 2 includes the subject matter of Example 1, wherein the gas pocket is an airgap.

Example 3 includes the subject matter of Examples 1 or 2, wherein the gas pocket has a height that is at least 5 nm at it tallest point.

Example 4 includes the subject matter of Example 3, wherein the gas pocket has a height that is at least 10 nm at it tallest point.

Example 5 includes the subject matter of Example 3, wherein the gas pocket has a height that is at least 20 nm at it tallest point.

Example 6 includes the subject matter of any of Examples 1-5, wherein the gas pocket has a volume of at least 5 $nm^3$.

Example 7 includes the subject matter of Example 6, wherein the gas pocket has a volume of at least 10 $nm^3$.

Example 8 includes the subject matter of Example 6, wherein the gas pocket has a volume of at least 100 $nm^3$.

Example 9 includes the subject matter of Example 6, wherein the gas pocket has a volume of at least 1000 $nm^3$.

Example 10 includes the subject matter of any of the foregoing Examples, wherein each of the first transistor structure and the second transistor structure comprises a body of semiconductor material with a source region and a drain region; a layer of dielectric material in contact with the body of semiconductor material; and a gate electrode in contact with the layer of dielectric material and vertically aligned with the body; wherein the gas pocket is at least partially laterally aligned with the body of semiconductor material. For example, an imaginary plane passes through the body of the first transistor structure, the body of the second transistor structure, and the gas pocket.

Example 11 includes the subject matter of Example 10, wherein the gate electrode is on an underlying base, the layer of dielectric material is on the gate electrode, and the body of semiconductor material is on the layer of dielectric material.

Example 12 includes the subject matter of any of Examples 10-11, wherein at least part of the gas pocket is positioned between a first contact on the body of semiconductor material of the first transistor structure and a second contact on the body of semiconductor material of the second transistor structure.

Example 13 includes the subject matter of Examples 10-12, wherein the gas pocket has a vertical size at least as great as a vertical thickness of the body of semiconductor material.

Example 14 includes the subject matter of any of Examples 10-13, wherein the gas pocket extends vertically above the body of semiconductor material.

Example 15 includes the subject matter of Example 14, wherein at least part of the gas pocket is positioned between metal interconnect on the first contact and metal interconnect on the second contact.

Example 16 includes the subject matter of any of Examples 1-15, further comprising a base, wherein the base comprises a semiconductor material and a layer of insulator material in contact with the semiconductor material.

Example 17 includes the subject matter of any of Examples 1-16, wherein gas in the gas pocket comprises oxygen and nitrogen.

Example 18 includes the subject matter of any of Examples 1-17, wherein the insulator material completely encapsulates the gas pocket such that the insulator material is on a first sidewall of the first transistor structure and on a second sidewall of the second transistor structure, and wherein at least a portion of the insulator material has a thickness less than 10 nm between the gas pocket and the first sidewall or the second sidewall.

Example 19 includes the subject matter of any of Examples 1-18, wherein the first transistor structure and the second transistor structure have a vertical height in a range of 25 nm to 100 nm, and wherein the gas pocket has a height in a range from 5 nm to 90 nm.

Example 20 includes the subject matter of any of Examples 1-19, wherein the vertical height of the transistor structure is from 50% to 150% of the height of the gas pocket.

Example 21 includes the subject matter of any of Examples 1-20, wherein gas occupies at least 10% of a volume between the first transistor structure and the second transistor structure.

Example 22 includes the subject matter of Example 21, wherein gas occupies at least 50% of a volume between the first transistor structure and the second transistor structure.

Example 23 is an integrated circuit structure comprising an array of transistor structures wherein adjacent transistor structures in the array are spaced by a gap of no more than 100 nm, and wherein at least some of the transistor structures include a body of semiconductor material, the body including a source region and a drain region, a gate electrode vertically aligned with the body, a gate dielectric between the gate electrode and the body, a source electrode in contact with the source region, and a drain electrode in contact with the drain region; isolation material on sidewalls of the transistor structures and at least partially encapsulating a gas pocket between adjacent transistor structures in the array; word lines electrically coupled to the gate electrode of columns of the transistor structures in the array; and bit lines electrically coupled to a source electrode and/or drain electrode of rows of the transistor structures in the array.

Example 24 includes the subject matter of Example 23, wherein the isolation material encapsulates the gas pocket in the gap between at least 90% of adjacent transistor structures in a first direction of the array.

Example 25 includes the subject matter of Example 23, wherein the isolation material encapsulates the gas pocket in the gap between at least 90% of adjacent transistor structures.

Example 26 includes the subject matter of any of Examples 23-25, wherein the gas pocket has a volume of at least 10 nm$^3$.

Example 27 includes the subject matter of any of Examples 1-26, wherein the gas pocket is substantially centered between adjacent transistor structures.

Example 28 includes the subject matter of Example 1-27, wherein a vertical height of the transistor structures is from 50% to 150% of a horizontal distance of the gap.

Example 29 includes the subject matter of any of Example 1-28, wherein a relative dielectric constant of the volume between adjacent transistor structures in the array is less than 3.0.

Example 30 includes the subject matter of Example 29, wherein the relative dielectric constant is less than 2.0.

Example 31 includes the subject matter of Example 23-27 further comprising metal interconnect on the source electrode and metal interconnect on the drain electrode, wherein at least part of the gas pocket is positioned between the metal interconnect on the source electrode of a first one of the transistor structures and the metal interconnect on the drain electrode of an adjacent second one of the transistor structures.

Example 32 is a method of fabricating an integrated circuit, the method comprising forming a first transistor structure and a second transistor structure, the second transistor structure spaced from a first transistor structure by a gap no greater than 100 nm, wherein the first transistor structure and the second transistor structure each include a layer of semiconductor material, a layer of dielectric material, and a gate electrode vertically aligned with and spaced from the layer of semiconductor material by the layer of dielectric material; and depositing a layer of insulator material in the gap, thereby encapsulating a gas pocket laterally between the first transistor structure and the second transistor structure. For example, an imaginary plane passes through a portion of the first transistor structure, a portion of the second transistor structure, and the gas pocket. The portion can be, for instance, the layer of semiconductor material.

Example 33 includes the subject matter of Example 32, wherein depositing the layer of insulator material is performed at least in part by atomic layer deposition.

Example 34 includes the subject matter of Example 33, wherein depositing the layer of insulator material also includes one of chemical vapor deposition or physical vapor deposition.

Example 35 includes the subject matter of any of Examples 32-34 and further comprises forming source and drain electrodes in contact with the layer of semiconductor material.

Example 36 includes the subject matter of any of Examples 32-35 and further comprises forming a wordline in the insulator material, the wordline electrically coupled to the gate electrode of the first transistor structure and the second transistor structure; and forming a bitline electrically coupled to the source and drain electrodes.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
   a first transistor structure;
   a second transistor structure, the second transistor structure spaced from the first transistor structure, wherein each of the first transistor structure and the second transistor structure comprises:
     a body of semiconductor material with a source region and a drain region;
     a gate dielectric layer in contact with the body of semiconductor material; and
     a gate electrode in contact with the gate dielectric layer and vertically aligned with the body; and
   an insulator material at least partially encapsulating a gas pocket laterally between the first transistor structure and the second transistor structure, wherein the gas pocket is at a same elevation as the gate dielectric layer of each of the first and second transistor structures, and wherein the insulator material is in direct contact with the body of semiconductor material of each of the first and second transistor structures, and wherein the insulator material is in direct contact with the gas pocket.

2. The integrated circuit of claim 1, wherein the gas pocket is an airgap.

3. The integrated circuit of claim 1, wherein the gas pocket has a height that is at least 5 nm at it tallest point.

4. The integrated circuit of claim 1, wherein the gas pocket has a volume of at least 5 nm$^3$.

5. The integrated circuit of claim 1, wherein the gate electrode is on an underlying base, the gate dielectric layer is on the gate electrode, and the body of semiconductor material is on the gate dielectric layer.

6. The integrated circuit of claim 1, wherein the gas pocket has a vertical size at least as great as a vertical thickness of the body of semiconductor material.

7. The integrated circuit of claim 1, wherein the gas pocket extends vertically above the body of semiconductor material.

8. The integrated circuit of claim 7, wherein at least part of the gas pocket is positioned between a first contact on the body of semiconductor material of the first transistor structure and a second contact on the body of semiconductor material of the second transistor structure.

9. The integrated circuit of claim 8, wherein at least part of the gas pocket is positioned between metal interconnect on the first contact and metal interconnect on the second contact.

10. The integrated circuit of claim 1, wherein the insulator material completely encapsulates the gas pocket such that the insulator material is on a first sidewall of the first transistor structure and on a second sidewall of the second transistor structure, and wherein at least a portion of the insulator material has a thickness less than 10 nm between the gas pocket and the first sidewall or the second sidewall.

11. The integrated circuit of claim 10, wherein gas occupies at least 10% of a volume between the first transistor structure and the second transistor structure.

12. The integrated circuit of claim 1, wherein the first transistor structure and the second transistor structure have a vertical height in a range of 25 nm to 100 nm, and wherein the gas pocket has a height in a range from 5 nm to 90 nm.

13. The integrated circuit of claim 12, wherein the vertical height of the transistor structure is from 50% to 150% of the height of the gas pocket.

* * * * *